United States Patent [19]
Bailey et al.

[11] Patent Number: 5,641,381
[45] Date of Patent: Jun. 24, 1997

[54] PREFERENTIALLY ETCHED EPITAXIAL LIFTOFF OF INP MATERIAL

[75] Inventors: Sheila G. Bailey, Lakewood; David M. Wilt, Bay Village; Frank L. DeAngelo, Parma, all of Ohio

[73] Assignee: The United States of America as represented by the Administrator of the National Aeronautics and Space Administration, Washington, D.C.

[21] Appl. No.: 411,357

[22] Filed: Mar. 27, 1995

[51] Int. Cl.$^6$ .................. B44C 1/22; H01L 21/306
[52] U.S. Cl. .................. 438/455; 216/2; 216/95; 216/96; 117/915; 438/745; 438/977
[58] Field of Search .................. 156/631.1, 633.1, 156/655.1, 662.1; 216/2, 95, 96

[56] References Cited

U.S. PATENT DOCUMENTS

| | | | |
|---|---|---|---|
| 4,686,001 | 8/1987 | Okazaki | 156/652 |
| 4,846,931 | 7/1989 | Gmitter et al. | 156/633.1 |
| 4,883,561 | 11/1989 | Gmitter et al. | 156/633.1 |
| 5,073,230 | 12/1991 | Maracas et al. | 156/633.1 |
| 5,201,996 | 4/1993 | Gmitter et al. | 156/655.1 |
| 5,286,335 | 2/1994 | Drabik et al. | 156/631.1 |

*Primary Examiner*—John S. Chu
*Attorney, Agent, or Firm*—Kent N. Stone; Vernon E. Williams

[57] ABSTRACT

The present invention is directed toward a method of removing epitaxial substrates from host substrates. A sacrificial release layer of ternary material is placed on the substrate. A layer of InP is then placed on the ternary material. Afterward a layer of wax is applied to the InP layer to apply compressive force and an etchant material is used to remove the sacrificial release layer.

13 Claims, 1 Drawing Sheet

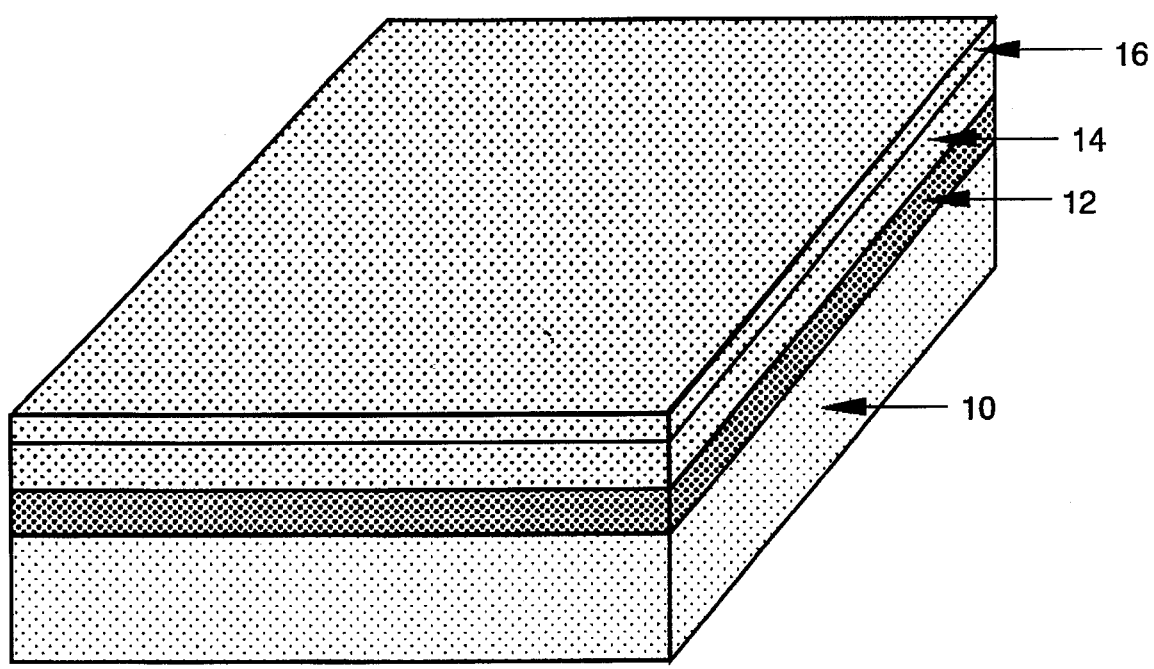

PREFERENTIALLY ETCHED EPITAXIAL LIFTOFF OF INP MATERIAL

ORIGIN OF THE INVENTION

The invention described herein was made by employees of the United States Government and may be manufactured and used by or for the Government for governmental purposes without the payment of any royalties thereon or therefor.

TECHNICAL FIELD

This invention is concerned with the removal of epitaxial films from host substrates. The invention is particularly concerned with the removal of such a film from an indium phosphide (InP) substrate.

The removal of epitaxial films from host substrates and the subsequent deposition on a new material has a wide variety of applications. In addition to the economic advantage of reusable substrates, the production of ultra-thin device layers has potential applications in optoelectronic devices, such as optical modulators or detectors, and thin film solar cells.

Preferentially etched epitaxial liftoff (PEEL) requires a release layer that can be removed using a selective etchant. The sacrificial release layer which as been used thus far for PEEL is aluminum arsenide (AlAs). Hydrofluoric acid (HF) is used as the etchant. A black wax, known commercially as Apiezon W, provides the tension required for undercutting as explained in Applied Physics Letter 51 which was published in 1987. As explained in Electronics Letter 25 which was published in 1989 and TuG 4 which was published in 1991, recent applications of this procedure have been limited to gallium arsenide (GaAs) thin film devices.

Such a procedure has not been utilized in any significant applications involving indium phosphide (InP) devices. This is attributed to the significant lattice mismatch between the AlAs and Inp. The lattice mismatch requires a pseudomorphic deposition of AlAs to avoid dislocations in the InP epitaxial film. Also, stringent control of the metal organic vapor phase epitaxy (MOVPE) is required to fabricate pseudomorphic layers. Thus, InP PEEL devices using AlAs have not been produced.

It is, therefore, an object of the present invention to provide for the preferentially etched epitaxial liftoff of InP.

Another object of the invention is to provide an improved method for the removal of epitaxial films from InP and the subsequent deposition of the films on a new material.

BACKGROUND ART

U.S. Pat. No. 4,846,931 to Gmitter et al discloses a method for selectively removing an epitaxial film from a single crystal substrate upon which it was grown. The method comprises the steps of selectively etching away a thin release layer positioned between the film and the substrate and causing the edges of the film to curl upwardly as the release layer is etched away. This enchances an outdiffusion of reaction products of the etching process from the active etching area. A solution of support layer material is sprayed on the epitaxial film layer.

U.S. Pat. No. 4,686,001 to Okazaki discloses a method for producing a semiconductor light emitting device that includes a step of removing an InP cover layer by a selective etching process. The InP cover layer on an InGaAs contact layer may be selectively removed by an etching process using HCl or HBr as an etchant so that the previously formed contact layer is exposed.

DISCLOSURE OF THE INVENTION

The aforementioned objects of the invention are achieved by using a method for preferential etching epitaxial liftoff (PEEL) of InP films by using an etchant based on $HF, H_2O_2$, $H_2O$. The InP films are lifted off a substrate removing an InGaAs layer without etching the InP. The method for lifting off the InP layer uses black wax on the InP film which provides compression and causes the film to lift off as it is undercut.

The method comprises mixing trichlorethylene with wax and spraying the resulting mixture on the InP layer. This layer is cured at room temperature for about 30 minutes, and then it is cured at 160° C. for about 30 minutes which generates the compressive forces for the peeling process. The edges are cleaned after curing. The substrate supporting the InP film is submerged in an etchant solution which dissolves an indium gallium arsenide sacrificial release layer. The etchant mixture solution is then diluted with deionized water. The film is gently removed, dried and bonded to a desired substrate.

BRIEF DESCRIPTION OF THE DRAWING

The objects, advantages, and novel features of the invention will be more fully apparent from the following detailed description when read in connection with the accompanying drawing which is a prospective view showing the InP PEEL process of the present invention.

BEST MODE FOR CARRYING OUT THE INVENTION

Referring now to the drawing, there is shown an indium phosphide [InP] substrate 10. A sacrificial release layer of indium gallium arsenide 12 is interposed between the substrate 10 and an indium phosphide cover layer 14. The indium gallium arsenide release layer 12 is a ternary material whose lattice constant can be varied by changing the In/Ga ratio. At a ratio of 0.53/0.47 the lattice constant is matched to InP; thus, the InGaAs release layer may be as thick as desired without introducing any deleterious defects into the overlying InP epilayers. By way of example, the InP substrate 10 may be about 300 um thick, the lattice matched InGaAs release layer 12 has a thickness of about 500 angstroms, and the InP epilayer 14 has a thickness of about 4 um.

PEEL structures of the type shown in the drawing require a highly selective etchant. By way of example, one such etchant is $HF:H_2O_2:H_2O$ (1:1:10). This etchant has been used successfully to produce PEEL InP films. Under room temperature conditions, this etchant slowly removes the InGaAs release layer 12 without etching the InP epilayer 14 or the InP substrate 10.

A commercially available black wax known as Apiezon W provides compression in the InP film. This compression causes the film 14 to lift as it is undercut, thereby permitting complete etching of the thin InGaAs release layer 12.

After the substrate 10 is covered by the sacrificial release layer 12 and the indium phosphide film 14 has been deposited on the layer 12, preparation is made to remove the indium phosphide film 14 and bond it to another substrate (not shown). In this manner the first substrate 10 may be reused for a sizeable reduction in the cost of the process.

The indium phosphide film 14 is covered with a layer of wax. A black wax sold commercially as Apiezon W has been satisfactory for this purpose. A mixture of trichlorethylene (TCE) and Apiezon type W wax is prepared. This mixture has a ratio of 40 aml of TCE to log of wax. The indium phosphide film is contacted with this mixture by spraying it with an air brush to create a thin layer 16 of wax. The layer 16 of wax has a thickness of about 40 mil.

The layer 16 of wax is then cured for about 30 minutes at room temperature. This is followed by a second curing of 30 minutes at about 160° C. This curing process generates the compressive forces necessary for the peeling process.

The aforementioned etchant solution is applied to the lattice matched InGaAs layer by submerging the substrate with the sacrificial release layer and indium phosphide film thereon in the aforementioned etchant solution. As the etchant solution dissolves the indium gallium arsenide, the sacrificial release layer 12 is removed from between the substrate 10 and the indium phosphide film 14. Once this separation occurs, the resulting free-floating thin indium phosphide film 14 is quite fragile even though it is supported by the wax layer 16. Thus, the InP film must be handled very carefully.

After the etchant solution is diluted with deionized water, a filter paper (not shown) may be placed beneath this film 14. The filter paper and film 14 are then gently removed from the diluted etchant solution. An advantage of using the filter paper is that it enables the film 14 to dry.

After drying, the film 14 is bonded to an appropriate substrate (not shown). Thus, the substrate 10 can be reused to produce additional InP films.

After the InP film 14 is bonded to the new substrate, the wax layer 16 is removed from the indium phosphide film by sequential baths of trichlorethylene (TCE).

DESCRIPTION OF THE ALTERNATE EMBODIMENT

Instead of removing the free-floating InP film 14 from the etchant solution by placing filter paper on the underside of this film, it is contemplated that the film 14 may be attached directly to the new substrate. In this embodiment, a Van der Waals bonding is utilized by the placement of the InP film onto the new substrate. The film 14 is transferred while still wet, and then dried slowly on the new substrate.

Several organic-based etchants have proven to possess the required selectivity to be used for PEEL film development. These etchants may facilitate the use of alternate processing sequences which could eliminate the fragile, free-floating, film stage. It is also contemplated that the structure shown in the drawing could be bonded to a cover glass superstate, tensioned to provide the required lifting force, and peeled.

The use of the InP as the sacrificial release layer is also contemplated. This layer would be bounded on either side by GaInAs lattice matched layers to act as etch barrier layers. Devices based on this inversion of the PEEL process include the InP/GaInAs monolithic cascade solar cell.

The quality of the electronic structures produced by this method are superior and more reproducible than prior art. The technique does not require sophisticated deposition equipment, and therefore it has greater potential commercialization.

A variety of applications can be envisioned for a PEEL structure. One of which is a PEEL InP top cell connected to a Si bottom cell to produce a highly efficient tandem solar cell structure. The PEEL technique also provides easy fabrication of optoelectronic devices in which monolithic growth is often difficult. Current use of thin InP has been in optoelectronic integrated circuits (OEIC) and Si-LSIs. A laser diode (LD) on a Si substrate is a key device for developing viable III–V/Si OEICs.

While several embodiments of the invention have been disclosed and described, it will be apparent that various structural modifications may be made without departing from the spirit of the invention or the scope of the subjoined claims.

What is claimed:

1. A method of producing a preferentially etched epitaxial liftoff (PEEL) of InP comprising covering a first substrate with a sacrificial release layer of a ternary material whose lattice constant can be varied, depositing a film of InP on said release layer, contacting the InP film with a layer of wax, curing said layer of wax thereby providing compressive forces to said InP film, applying an etchant solution to said ternary material to undercut said InP film whereby said release layer is removed from between said first substrate and said InP film, bonding said InP film to a second substrate, and removing said layer of wax from said InP film, wherein said ternary material of the sacrificial release layer is lattice-matched InGaAs, and said etchant is $HF:H_2O_2:H_2O$ (1:1:10).

2. A method as claimed in claim 1 wherein the first substrate with the InP film thereon is submerged in said etchant solution to dissolve the sacrificial release layer.

3. A method as claimed in claim 2 further comprising the step of diluting the etchant solution after the InP film has separated from the first substrate.

4. A method as claimed in claim 3 further comprising either the step of supporting the InP film on filter paper and drying said InP film after removal from the etchant solution, or the step of supporting the InP film in the etchant solution on the second substrate, and removing the second substrate with the film thereon from the etchant solution.

5. A method as claimed in claim 4 wherein the InGaAs has a lattice constant that is matched to InP whereby the thickness of the InGaAs layer can be increased without introducing deleterious defects into the overlaying InP layer.

6. A method as claimed in claim 5 wherein the InGaAs material has an In/Ga ratio of 0.53/0.47.

7. A method as claimed in claim 6 wherein the wax layer is provided by applying a mixture of trichlorethylene and wax to the InP film.

8. A method as claimed in claim 7 wherein the mixture is sprayed onto the InP film.

9. A method as claim in claim 8 wherein a 40 mil thick layer of wax is sprayed onto the InP film.

10. A method as claimed in claim 9 wherein the wax is cured for about 30 minutes at room temperature.

11. A method as claimed in claim 10 wherein the wax is cured a second time for about 30 minutes at about 160° C.

12. A method of producing a preferentially etched epitaxial liftoff (PEEL) of InP comprising covering a first substrate with a sacrificial release layer of a ternary material whose lattice constant can be varied, depositing a film of InP on said release layer, contacting the InP film with a layer of wax, curing said layer of wax thereby providing compressive forces to said InP film, applying an etchant solution to said ternary material to undercut said InP film whereby said release layer is removed from between said first substrate and said InP film, bonding said InP film to a second substrate, and removing said layer of wax from said InP film, wherein said ternary material of the sacrificial release layer is AlInAs, and said etchant is $HF:H_2O_2:H_2O$ (1:1:10).

13. A method as claimed in claim 12 wherein the AlInAs material has an Al/In ratio of 0.48/0.52.

* * * * *